United States Patent [19]

Kakimi

[11] Patent Number: 4,842,977

[45] Date of Patent: * Jun. 27, 1989

[54] LIGHT-SENSITIVE MATERIAL CONTAINING SILVER HALIDE, REDUCING AGENT, POLYMERIZABLE COMPOUND AND A BASE OR BASE PRECURSOR

[75] Inventor: Fujio Kakimi, Kanagawa, Japan

[73] Assignee: Fuji Photo Film Co., Ltd., Kanagawa, Japan

[*] Notice: The portion of the term of this patent subsequent to Jul. 19, 2005 has been disclaimed.

[21] Appl. No.: 149,455

[22] Filed: Jan. 28, 1988

[30] Foreign Application Priority Data

Jan. 28, 1987 [JP] Japan ................................. 62-18084

[51] Int. Cl.$^4$ ................................................. G03C 1/72
[52] U.S. Cl. .................................... 430/138; 430/203; 430/617; 430/925
[58] Field of Search ................ 430/138, 617, 203, 958

[56] References Cited

U.S. PATENT DOCUMENTS

| | | |
|---|---|---|
| 4,066,568 | 1/1978 | Nakazawa et al. ................. 430/138 |
| 4,629,676 | 12/1986 | Hayakawa et al. ................. 430/203 |
| 4,640,892 | 2/1987 | Kawata et al. ..................... 430/617 |
| 4,758,496 | 7/1988 | Kakimi ............................... 430/138 |
| 4,760,011 | 7/1988 | Kakimi ............................... 430/138 |

FOREIGN PATENT DOCUMENTS 0203613  12/1986  European Pat. Off. .

Primary Examiner—Paul R. Michl
Assistant Examiner—Patrick A. Doody
Attorney, Agent, or Firm—Sughrue, Mion, Zinn, Macpeak & Seas

[57] ABSTRACT

A light-sensitive material comprises a light-sensitive layer which contains silver halide, a reducing agent, a polymerizable compound and a base or base precursor provided on a support. The silver halide and polymerizable compound are contained in microcapsules to form light-sensitive microcapsules which are dispersed in the light-sensitive layer. The base or base precursor is contained in particles which are arranged outside of the light-sensitive microcapsules. At least 30% of the particles are adsorbed on the surface of the light-sensitive microcapsules.

12 Claims, No Drawings

LIGHT-SENSITIVE MATERIAL CONTAINING SILVER HALIDE, REDUCING AGENT, POLYMERIZABLE COMPOUND AND A BASE OR BASE PRECURSOR

BACKGROUND OF THE INVENTION

1. Field of the invention

This invention relates to a light-sensitive material comprising a light-sensitive layer containing silver halide, a reducing agent and a polymerizable compound provided on a support.

2. Description of prior art

Light-sensitive materials comprising a light-sensitive layer containing silver halide, a reducing agent and a polymerizable compound provided on a support can be used in an image forming method in which a latent image of silver halide is formed, and then the polymerizable compound is polymerized to form the corresponding image.

Examples of said image forming methods are described in Japanese Patent Publication Nos. 45(1970)-11149 (corresponding to U.S. Pat. No. 3,697,275), 47(1972)-20741 (corresponding to U.S. Pat. No 3,687,667) and 49(1974)-10697, and Japanese Patent Provisional Publication Nos. 57(1982)-138632, 57(1982)-142638, 57(1982)-176033, 57(1982)-211146 corresponding to U.S. Pat. No. 4,557,997), 58(1983)-107529 (corresponding to U.S. Pat. No. 4,560,637), 58(1983)-121031 corresponding to U.S. Pat. No. 4,547,450) and 58(1983)-169143. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore the process takes a relatively long time for the operation.

An improved image forming method employing a dry process is described in Japanese Patent Provisional Publication Nos. 61(1986)-69062 and 61(1986)-73145 (the contents of both publications are described in U.S. Pat. No. 4,629,676 and European Patent Provisional Publication No. 0174634A2). In this image forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to form a latent image, and then the material is heated to polymerize within the area where the latent image of the silver halide has been formed.

The above-mentioned image forming methods are based on the principle in which the polymerizable compound is polymerized within the area where a latent image of the silver halide has been formed.

Japanese Patent Provisional Publication No. 61(1986)-260241 describes another image forming method in which the polymerizable compound within the area where a latent image of the silver halide has not been formed is polymerized. In this method, when the material is heated, the reducing agent functions as polymerization inhibitor within the area where a latent image of the silver halide has been formed, and the polymerizable compound within the other area is polymerized.

The polymerization reaction in the image forming method smoothly proceeds under alkaline conditions. Therefore, a base or base precursor is preferably contained in the light-sensitive layer. Examples of the base and base precursor are described in Japanese Patent Provisional Publication Nos. 61(1986)-69062, 61(1986)-73145 and 61(1986)-260241.

SUMMARY OF THE INVENTION

According to study of the present inventor, it has been found that the sensitivity of a light-sensitive material which contains a base or base precursor in the light-sensitive layer tends to lower while the material is preserved under certain conditions.

In order to eliminate the above-mentioned problem, the present inventor has provided a light-sensitive material, wherein the compounds of the light-sensitive layer, such as silver halide, a polymerizable compound, are contained in microcapsules to form light-sensitive microcapsules, and the base or base precursor is contained in particles which are arranged outside of the light-sensitive microcapsules. The light-sensitive material is improved in the preservability, since the base or base precursor is separated from the components of the light-sensitive layer. The base or base precursor permeates the light-sensitive microcapsules in a heat development process. Therefore, the base or base precursor can effectively accelerate the polymerization reaction in the image forming process.

In more detail, copending Japanese Patent Application No. 61(1986)-52992 (corresponding to U.S. patent application Ser. No. 024,492, which was filed on Mar. 11, 1987 in the name of the present inventor) describes a light-sensitive material wherein the particles containing a base or base precursor are dispersed grains of a hydrophobic organic base compound and/or base precursor having a melting point of from 80° C. to 180° C. Further, copending Japanese Patent Application Nos. 61(1981)-52988 and 61(1981)-52989 (corresponding to U.S. patent application Ser. Nos. 024,484 and 024,497 respectively, both of which were filed on Mar. 11, 1987 in the name of the present inventor) describes a light-sensitive material wherein the particles containing a base or base precursor are microcapsules other than the light-sensitive microcapsules.

The present inventor has further studied the light-sensitive material wherein a base or base precursor is arranged outside of the light-sensitive microcapsules.

An object of the present invention is to provide a light-sensitive material which is improved in the preservability and gives an improved clear image.

There is provided by the present invention a light-sensitive material comprising a light-sensitive layer containing silver halide, a reducing agent, a polymerizable compound and a base or base precursor provided on a support, said silver halide and polymerizable compound are contained in microcapsules to form light-sensitive microcapsules which are dispersed in the light-sensitive layer, wherein the base or base precursor is contained in particles which are arranged outside of the light-sensitive microcapsules, at least 30% of said particles being adsorbed on the surface of the light-sensitive microcapsules.

In the present invention, at least 30% of the particles containing a base or base precursor is adsorbed on the surface of the light-sensitive microcapsules so that the base or base precursor more rapidly permeates the light-sensitive microcapsules in a heat development process.

In a light-sensitive material employing the light-sensitive microcapsules, the polymerization reaction proceeds within the microcapsules. Accordingly, the polymerization reaction in the image forming method smoothly proceeds, when the inside of the microcapsules is in an alkaline condition. The light-sensitive layer as a whole should not be in the alkaline condition.

In the light-sensitive material of the invention, the pH rapidly rises within the light-sensitive microcapsules, since the base or base precursor rapidly permeates the microcapsules in a heat development process. Therefore, the polymerization reaction smoothly and rapidly proceeds so that the light-sensitive material gives an improved clear image.

Further, comparing the base or base precursor adsorbed on the light-sensitive microcapsules with that liberated from the microcapsules, the former effectively permeates the microcapsules. In other words, a relatively large amount of the base or base precursor functions within the light-sensitive microcapsules, where the base or base precursor is adsorbed on the microcapsules. Therefore, another advantage of the light-sensitive material of the invention is that the necessary amount of the base or base precursor is relatively small.

The light-sensitive material of the invention is improved in the preservability similarly to the light-sensitive materials in which the base or base precursor is arranged outside of the light-sensitive microcapsules, since the base or base precursor is separated from the components of the microcapsules. Therefore, the sensitivity of the light-sensitive material scarcely lowers even if the material is preserved for a long term or under severe conditions.

DETAILED DESCRIPTION OF THE INVENTION

In the light-sensitive material of the present invention, at least 30% of the particles containing a base or base precursor are adsorbed on the surface of the light-sensitive microcapsules. More preferably at least 50%, and most preferably at least 70% of the particles are adsorbed on the surface of the microcapsules.

In the present invention, the ratio (%) of the adsorbed particles to the total particles is represented by the number of the particles. The number of the adsorbed particles can be easily observed and counted under an optical microscope or electron microscope.

The particles containing a base or base precursor may be solid particles (grains) of the base or base precursor. Further, the particles may microcapsules containing the base or base precursor other than the light-sensitive microcapsules. Furthermore, the particles may be in the form of a solid solution comprising the base or base precursor and a hydrophobic substance.

At least 30% of the particles containing a base or base precursor can be adsorbed on the light-sensitive microcapsules, for instance, by the following manner.

(1) In preparation of the light-sensitive microcapsules (particularly microcapsules having a shell material composed of polyurea or aminoaldehyde resin), an anionic protective colloid is preferably used. In this case, the protective colloid is adsorbed on the surface of the microcapsules. The base can be further adsorbed on the surface by electrostatic force of attraction between the base (cation) and the protective colloid.

(2) The light-sensitive microcapsules can be prepared in the presence of a solid base precursor to form a shell of the microcapsules. As a result, the base precursor is adsorbed on the surface of the microcapsules.

(3) In preparation of the light-sensitive material, the particles containing the base or base precursor can be dispersed or dissolved in a medium, such as an alcohol. Mixing the dispersion or solution of the base or base precursor with a dispersion of the light-sensitive microcapsules and then evaporating the medium, the particles are adsorbed on the microcapsules.

There is no specific limitation with respect to the base or base precursor.

Preferred examples of the inorganic bases include a combination of zinc hydroxide or zinc oxide and a chelating agent (e.g., sodium picolinate); ammonium hydroxide; and hydroxides of quaternary alkylammoniums. Preferred examples of the organic bases include heterocyclic amines, amidines, cyclic amidines, guanidines, and cyclic guanidines.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonyl-acetate, guanidine 4-chlorophenylsulfonylacetate, guanidine 4-methyl-sulfonylphenylsulfonylacetate, and 4-acetylaminomethyl propionate.

In the light-sensitive material of the invention, the base or base precursor has a melting point in the range of 70° to 210° C. The base or base precursor preferably is hydrophobic. In more detail, the base or base precursor has a solubility in water of not more than 0.1 weight % at 25° C. The base or a base formed from the base precursor preferably has a pKa of not less than 7.

These bases or base precursors are preferably used in an amount of not more than 100% by weight, and more preferably from 0.1 to 40% by weight, based on the total solid content of the light-sensitive layer. These bases or base precursors can be used singly or in combination.

In the light-sensitive material of the invention, the base or base precursor preferably is a guanidine derivative. Examples of the guanidine derivative have the following formula (I) or (II).

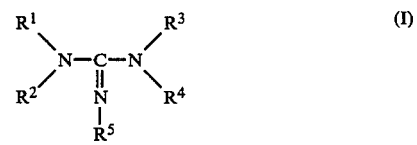

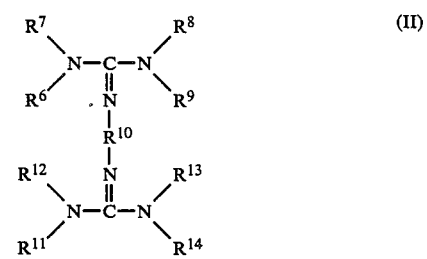

In the formulas (I) and (II), each of $R^1$ to $R^9$ and $R^{11}$ to $R^{14}$ independently is a monovalent group selected from the group consisting of hydrogen, an alkyl group containing 1-18 carbon atoms, a cycloalkyl group, an aralkyl group, amino, an alkylamino, an acylamino, carbamoylamino a heterocyclic group and an aryl group which may be substituted with a monovalent group selected from the group consisting of a lower alkyl group, an alkoxyl group, nitro, an acylamino group, an alkylamino group and a halogen atom; and $R^{10}$ is a divalent group selected from the group consisting of a lower alkylene, phenylene, naphthylene and

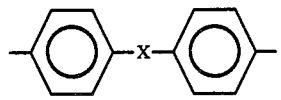

(X is a single bond or a divalent group selected from the group consisting of a lower alkylene, —$SO_2$—, —$S_2$—, —S—, —O— and —NH—).

Concrete examples of the guanidine derivative will be described hereinafter. In the following formula,

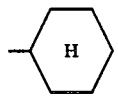

is cyclohexyl.

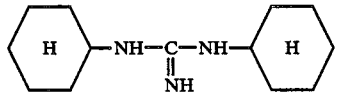 (1)

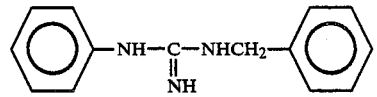 (2)

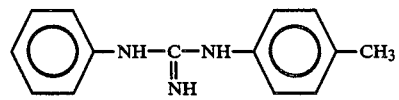 (3)

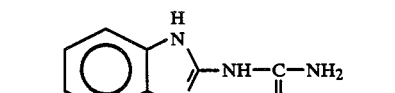 (4)

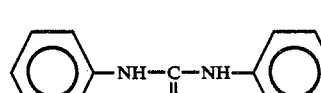 (5)

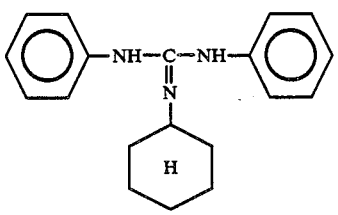 (6)

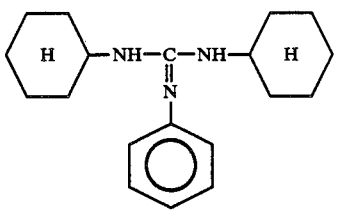 (7)

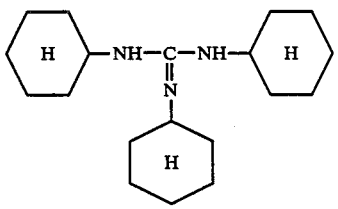 (8)

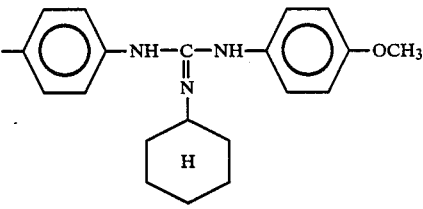 (9)

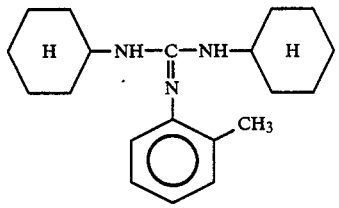 (10)

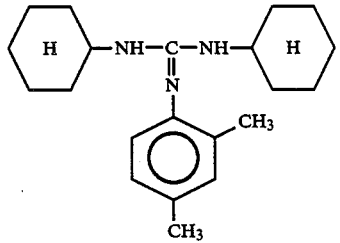 (11)

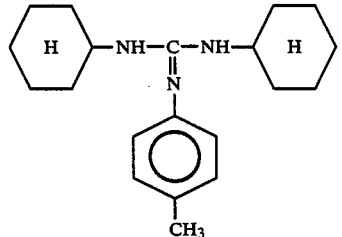 (12)

-continued
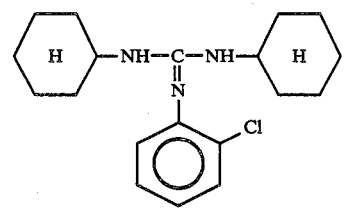 (13)
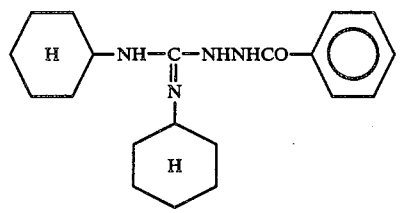 (14)
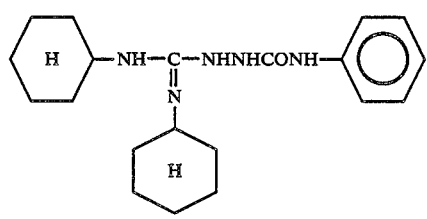 (15)
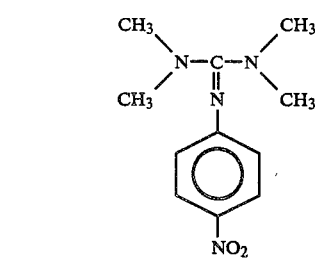 (16)
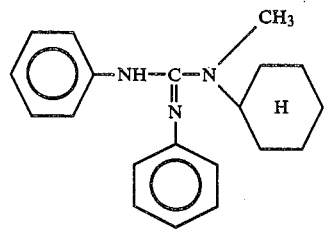 (17)
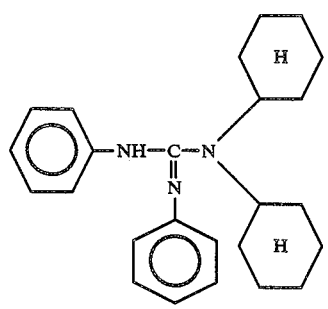 (18)
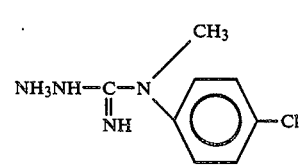 (19)
-continued
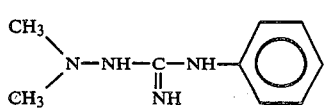 (20)
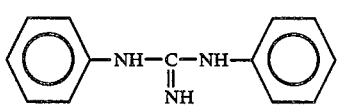 (21)
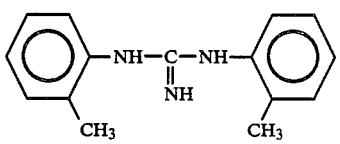 (22)
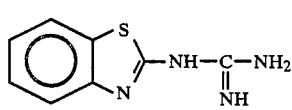 (23)
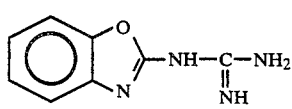 (24)
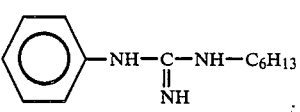 (25)
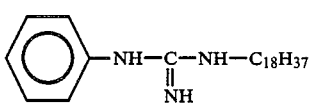 (26)
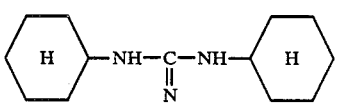 (27)
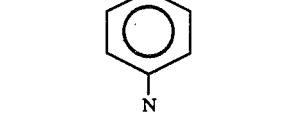 (28)
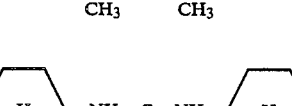 (29)

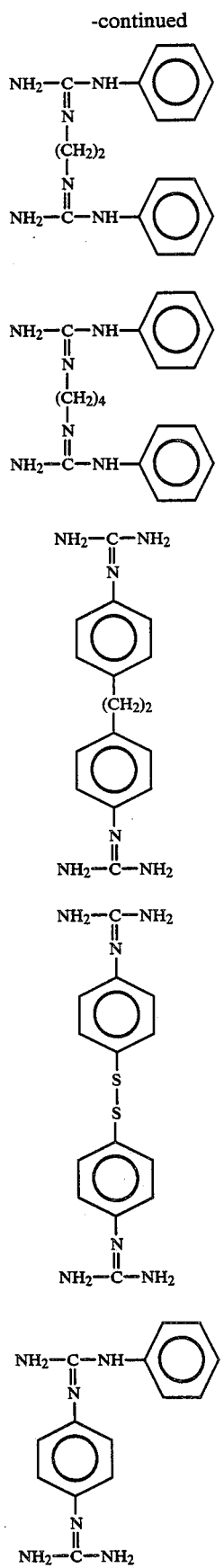
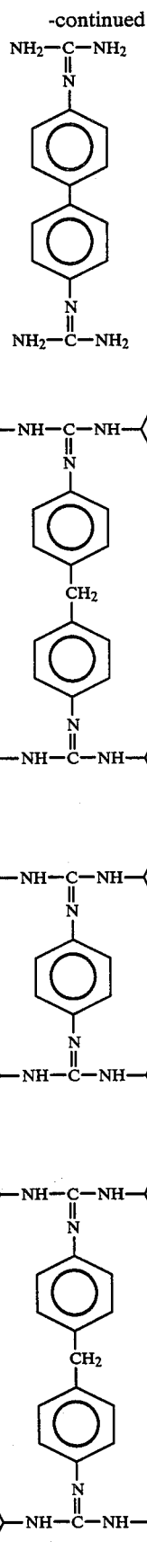

-continued

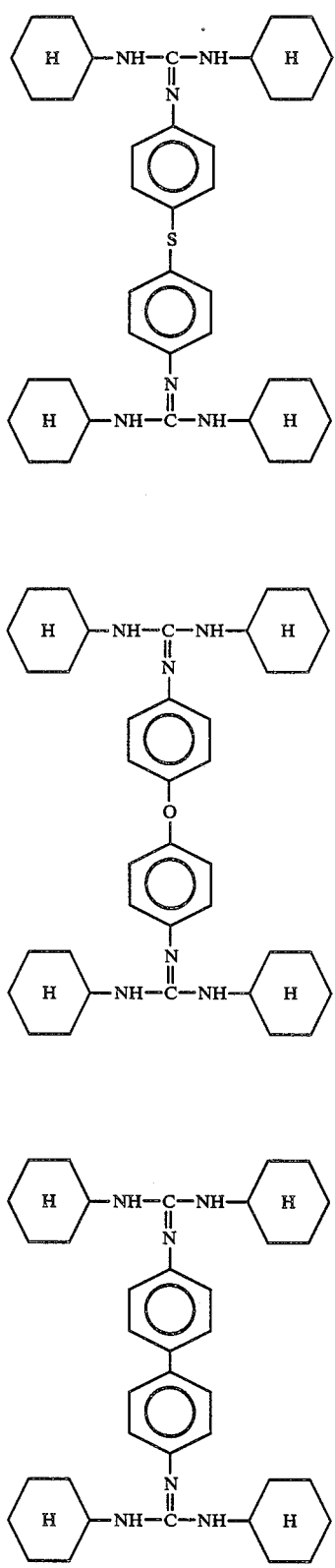

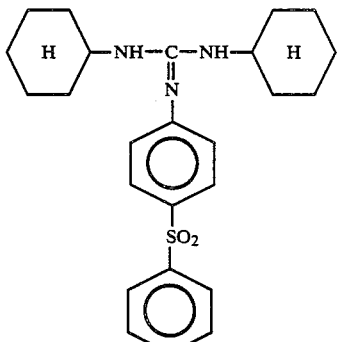

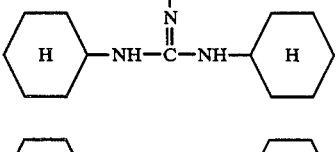

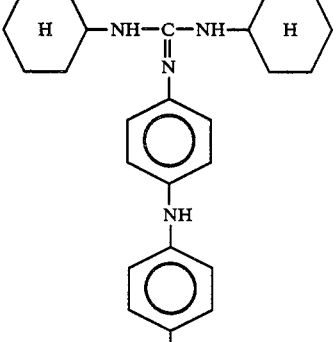

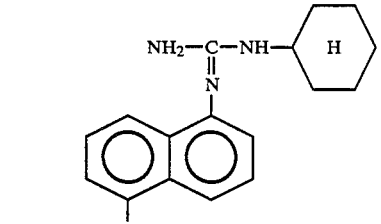

The guanidine derivatives having the following formula (III) are most preferably used in the invention.

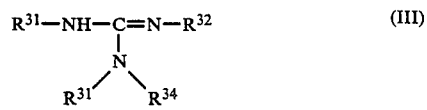

In the formula (III), each of $R^{31}$ and $R^{32}$ independently is a monovalent group selected from the group consisting of an alkyl group containing 6 or more carbon atoms, an aralkyl group and a cycloalkyl group containing 6 or more carbon atoms, each of which may have one or more substituent groups.

Each of $R^{33}$ and $R^{34}$ independently is a monovalent group selected from the group consisting of an alkyl group, an aralkyl group, a cycloalkyl group and aryl group, each of which may have one or more substituent groups.

Alternatively, $R^{33}$ and $R^{34}$ form a heterocyclic ring together with the neighboring nitrogen atom (the heterocyclic ring may have one or more substituent groups).

The total number of the carbon atoms contained in $R^{31}$, $R^{32}$, $R^{33}$ and $R^{34}$ is not less than 25.

The alkyl group as for $R^{31}$, $R^{32}$, $R^{33}$ and $R^{34}$ preferably contains 6 to 18 carbon atoms. Examples of the alkyl group (including the group having a substituent group) include hexyl, octyl, dodecyl, octyloxyethyl and butoxyethyl.

Examples of the aralkyl group as for $R^{31}$, $R^{32}$, $R^{33}$ and $R^{34}$ (including the group having a substituent group) include benzyl, α-methylbenzyl, β-phenethyl, p-chlorobenzyl and p-methoxybenzyl.

Examples of the cycloalkyl group as for $R^{31}$, $R^{32}$, $R^{33}$ and $R^{34}$ (including the group having a substituent group) include cyclohexyl, 4-methylcyclohexyl and 2-methylcyclohexyl.

The aryl group as for $R^{33}$ and $R^{34}$ preferably contains 6 to 24 carbon atoms. Examples of the alkyl group (including the group having a substituent group) include phenyl, 1-naphthyl, p-tryl, p-butoxyphenyl, 2,4-dimethylphenyl and 2,5-diethoxyphenyl.

Examples of the heterocyclic ring which $R^{33}$ and $R^{34}$ *form together with the neighboring nitrogen atom include*

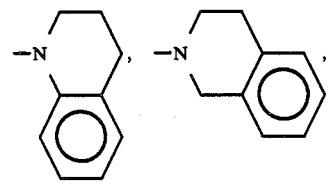

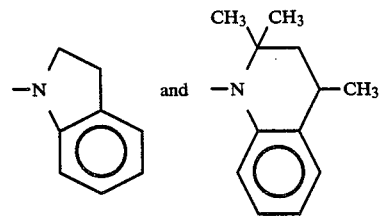

Concrete examples of the guanidine derivative having the formula (III) are described hereinafter.

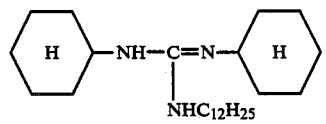
(51)

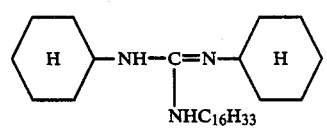
(52)

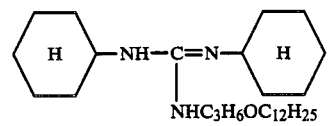
(53)

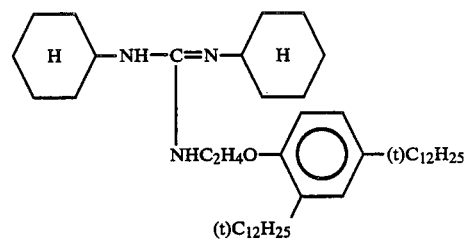
(54)

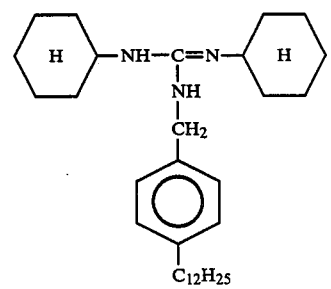
(55)

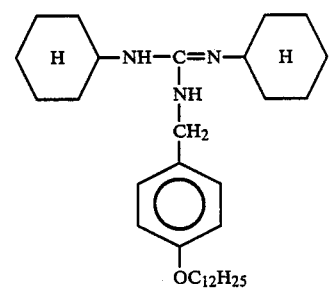
(56)

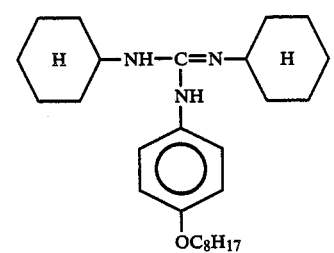
(57)

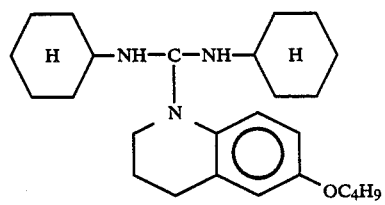
(58)

-continued
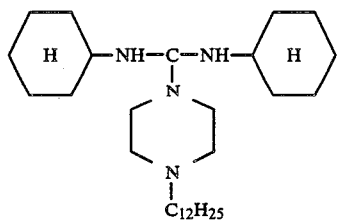 (59)
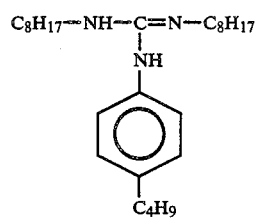 (60)
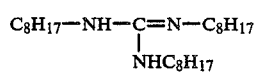 (61)
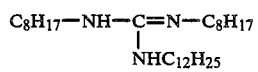 (62)
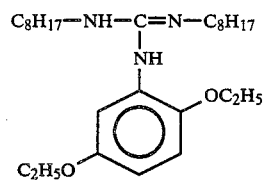 (63)
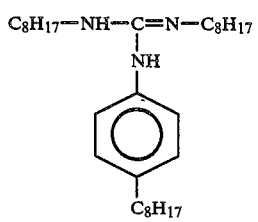 (64)
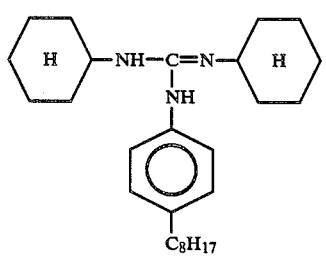 (65)
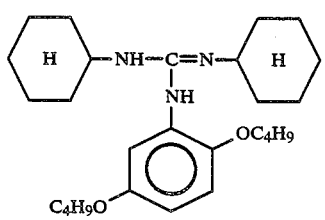 (66)
-continued
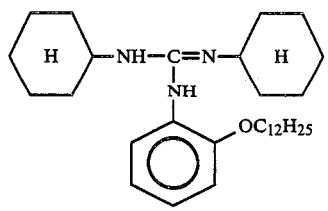 (67)
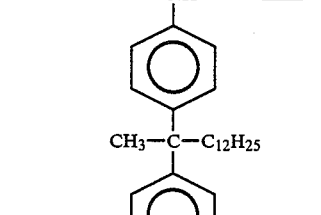 (68)
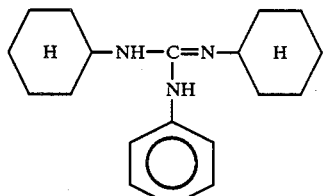 (69)
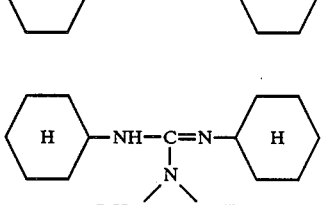 (70)
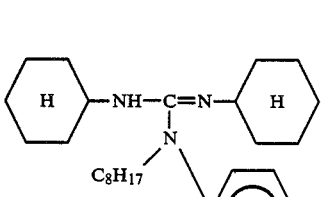 (71)

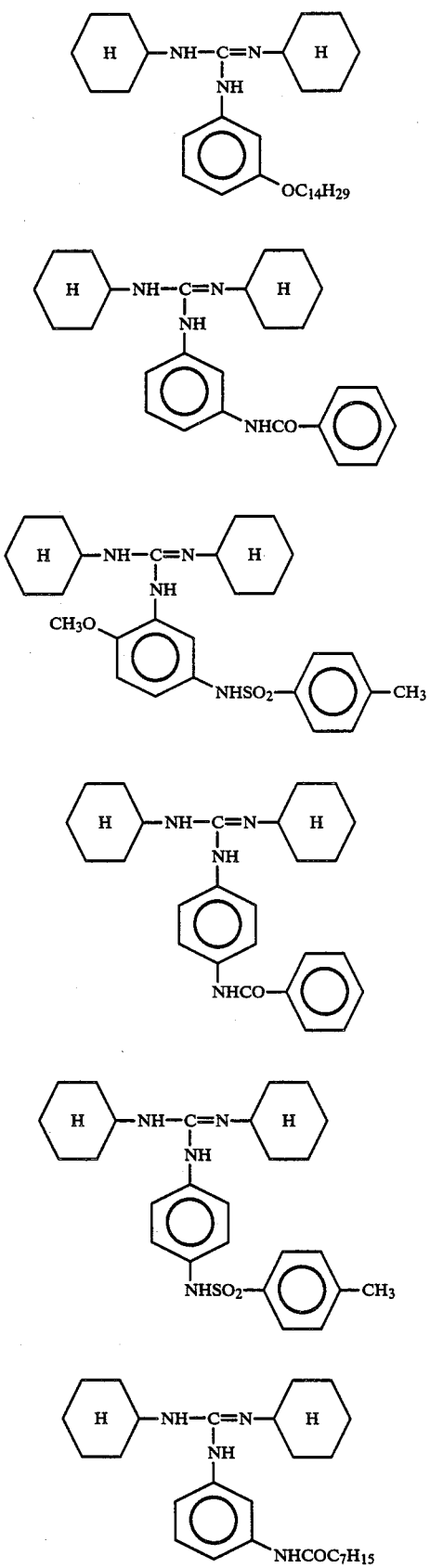

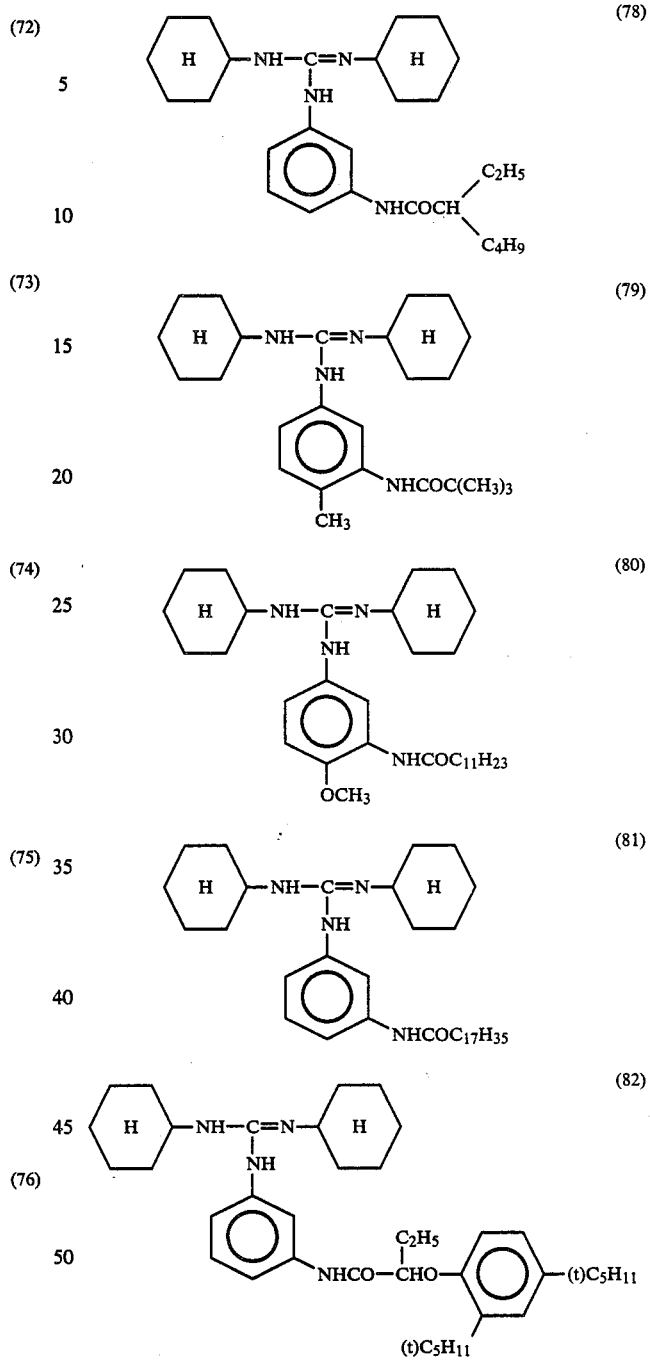

Where the base or base precursor having a melting point in the range of 70° to 210° C. (preferably further having a solubility in water of not more than 0.1 weight % at 25° C.), for example in the case that the base or a base formed from the base precursor is the above mentioned guanidine derivative, the base or base precursor can be in the form of solid particles (grains).

The particles containing the base or base precursor can be in the form of microcapsules other than the light-sensitive microcapsules.

The shell of the microcapsule containing the base or base precursor can be prepared by conventional methods using polyurea resin, polyurethane resin, polyamide resin, polyester resin, epoxy resin, aminoaldehyde resin, gelatin and a mixture of these polymers.

However, in order to improve easiness in releasing the base or base precursor during the developing process as well as preservability thereof, the shell of the microcapsule is preferably made of a heat melting or heat softening material having a melting point or softening point in the range of 50° C. to 200° C. Preferred examples of the heat-melting material include a wax. Known waxes such as a natural wax, petroleum wax and synthetic wax may be employed as the shell material of the microcapsule containing the base or base precursor in the light-sensitive material of the invention.

Examples of waxes employable as a shell material of the microcapsule containing the base or base precursor in the light-sensitive material of the invention are shown as follows:

(1) natural wax: vegetable wax (e.g., carnauba wax, rice wax and Japan wax), animal wax (e.g., beeswax, lanolin, spermaceti), mineral wax (e.g., montan wax, ozokerite, ceresin wax);

(2) petroleum wax: paraffin wax, microcrystalline wax;

(3) synthetic wax: petroleum synthetic wax, polyethylene wax, Fischer-Tropsch wax, synthetic fatty wax (e.g., cured castor oil, aliphatic amide, ketone, amine, imide, esters).

The microcapsule containing the base or base precursor may further contain a hot-melt solvent.

The term "hot-melt solvent" in the specification means that a solvent which is solid at a room temperature and melts at a certain temperature during the heat development process to function as a solvent of the base. Examples of the hot-melt solvents preferably employable in the invention include compounds belonging to urea, urethane, amide, pyrizine, sulfonamide, sulfon, sulfoxide, ester, ketone and ether, having a melting point of not lower than 40° C.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having $-SO_2-$ and/or $-CO-$ group described in U.S. Pat. No. 3,347,675; polar compounds described in U.S. Pat. No. 3,667,959; and 1,10-decanediol, methyl anisate and biphenyl suberate described in Research Disclosure 26-28 (December 1976). The hot-melt solvent is preferably used in an amount of from 0.5 to 50% by weight, and more preferably from 1 to 20% by weight, based on the total solid content of the light-sensitive layer.

The base or base precursor can be contained in a microcapsule under condition that the base or base precursor is dissolved or dipsersed in an aqueous medium containing a water retention agent.

The microcapsule containing an aqueous solution which contains the water retention agent and the base or base precursor can be prepared by forming the shell of the microcapsule around the micro-droplet of the aqueous solution by conventional methods.

The water retention agent is a substance showing a high viscosity such as forming a gel upon dissolution or dispersion in water and capable of reducing evaporation of water. Preferred examples include polyol and water soluble polymers.

Examples of the water soluble polymers serving as the water retention agent include various kinds of water soluble polymers having at least one functional group in the molecule such as a hydroxyl group, carboxylic acid group, carboxylic acid salt group and acid amide group. Concrete examples of the water soluble polymers include polyacrylic acid, polyacrylate salt, sodium alginate, carboxymethyl cellulose, salt of carboxymethyl cellulose, polyacrylamide, derivatives of polyacrylamide, polyhydroxymethyl methacrylate, pulluran, acrylic acid copolymer, salt of acrylic acid copolymer, acrylic acid(salt)-grafted starch, vinyl alcohol-acrylic acid(salt) copolymer, polyacrylonitrile grafted starch, hydrolyzed methyl acrylate-vinylacetate copolymer, and polyethylene oxide. These polymers may be crosslinked in two or three dimensional directions.

Concrete examples of water soluble polymers and crosslinked substances employable as the water retention agent include Aquakeep 4S (acrylic polymer, water absorption ability: approx. 400 ml/g, produced by Seitetsu Chemical Industries, Co., Ltd.), Aquakeep 10SH (acrylic polymer, water absorption ability: approx. 800–1000 ml/g, produced by Seitetsu Chemical Industries, Co., Ltd.), Sunwet IM-300 (starch grafted with acrylic acid (salt), water absorption ability: approx. 700 ml/g, produced by Sanyo Chemical Industries, Co., Ltd.), Sunwet IM-1000 (starch grafted with acrylic acid(salt), water absorption ability: approx. 1,000 ml/g, produced by Sanyo Chemical Industries, Co., Ltd.), Poids SA-20 (powdery acrylic polymer, water absorption ability: approx. 400 ml/g, produced by Kao Corporation), KI Gel-201K (reaction product of polyvinyl alcohol and cyclic acid anhydride, water absorption ability: approx. 200 ml/g, produced by Kuraray Isoprene Chemical Co., Ltd.), Sumicagel S-50 (vinyl alcohol-acrylic acid polymer, water absorption ability: approx. 500 ml/g, produced by Sumitomo Chemical Industries Co., Ltd.), Sumikagel N-100 (polyacrylic acid soda, water absorption ability: approx. 1,000 ml/g, produced by Sumitomo Chemical Industries Co., Ltd.), Igeta gel (anhydride of methylacrylate-vinylacetate copolymer, water absorption ability: approx. 500 ml/g, produced by Sumitomo Chemical Industries, Co., Ltd.), Jelfine (carboxymethyl cellulose, water absorption ability: approx. 200 ml/g, produced by Dicel Chemical Industires Co., Ltd.), OKS-7702 (polyvinyl alcohol-maleate copolymer, water absorption ability: approx. 250 ml/g, produced by Nippon Gosei Chemical Industires Co., Ltd.), OKS-7703 (polyvinyl alcohol-maleate copolymer, water absorption ability: approx. 270 ml/g, produced by Nippon Gosei Chemical Industires Co., Ltd.), Aqualon C (carboxymethyl cellulose in the form of linters, water absorption ability: approx. 35–45 ml/g, produced by Hercules Co., Ltd.), Ranseal (acryl fiber, water absorption ability: approx. 600 ml/g, Nippon Exlan Industries, Co., Ltd.), Ranseal F (acryl fiber, water absorption ability: approx. 150 ml/g, Nippon Exlan Industries, Co., Ltd.), SGP water absorbing polymer (starch derivative, water absorption ability: 1,000–1,200 ml/g, produced by Henkel Corp.), PEO8 (polyethylene oxide, produced by Seitetsu Chemical Industries, Co., Ltd.), Carboball 934, 940, 941 (carboxyvinyl polymers, produced by B. F. Goodrich), Primal ASE-60, ASE-75, RM-5, QR-708 (acrylic emulsion, produced by Rohm & Haas), Acrysol GS (aqueous acrylic solution, produced by Rohm & Haas) and Disparon #6900-10X (aqueous polyamide solution, produced by Kusumoto Kasei Co., Ltd.).

Polyols such as glycerol, diethylene glycol, triethylene glycol and propylene glycol may be employed as the water retention agents in the invention.

Polymers having high water absorption properties and employable as the water retention agent are described in "Fiber and Industries" vol. 38 No. 10, 459–465 (1982), edited by Fiber Society.

The water retention agent and base (base or base precursor) can be dissolved or dispersed in water in a conventional manner. There is no specific limitation with respect to the amount of the retention agent. The amount may be determined depending on the water absorption ability thereof. The water retention agent preferably is contained in the microcapsule in the amount of from 0.1 weight % to 30 weight % of the microcapsule.

The aqueous medium usually consists essentially of water. However, the aqueous medium may contain a watermiscible organic solvent such as alcohol, ketone and ester.

The particles containing the base or base precursor can be in the form of a solid solution comprising the base or base precursor and a hydrophobic substance. The hydrophobic substance should be miscible with the base or base precursor, and preferably has a solubility in water of not more than 0.1 weight % at 25° C.

The hydrophobic substance is preferably used in an amount of 0.5 to 20 times (by weight) as much as the amount of the base or base precursor.

The state of the solid solution can be confirmed by a differential thermal analysis using DSC.

The hydrophobic substance preferably has a glass transition temperature in the range of 40° to 250° C. (more preferably 60° to 200° C.). Alternatively, the hydrophobic substance preferably has a melting point in the range of 60° to 140° C. (more preferably 80° to 120° C.).

Examples of the hydrophobic substance having a glass transition temperature in the range of 40° to 250° C. include polyethylene, polypropylene, polystyrene, styrene-butadiene copolymer, styrene-acrylonitrile-butadiene copolymer, polymethyl acrylate, polyethyl acrylate, polybutyl acrylate, polybenzyl acrylate, polymethyl methacrylate, polyethyl methacrylate, polybutyl methacrylate, polyisobutyl methacrylate, poly-2-ethylhexyl methacrylate, polyvinyl chloride, polyvinyl formal, polyvinyl butyral, polyvinyl acetate, polydiacetone acrylamide, cellulose diacetate, cellulose triacetate, cellulose acetate phthalate, poly-$\gamma$-methyl glutamate, poly-$\gamma$-benzyl glutamate, polybisphenol A carbonate and polybisphenol S carbonate. Among them, polystyrene (glass transition temperature: 100° C.) and polybisphenol A carbonate (glass transition temperature: 145° C.) are preferred.

Examples of the hydrophobic substance having a melting point in the range of 60° to 140° C. are the same as the examples of the above-mentioned hot-melt solvent.

The light-sensitive microcapsules containing silver halide and the polymerizable compound, the reducing agent and the support which constitute the light-sensitive material of the invention are described below. Thus composed material is referred hereinafter to as "light-sensitive material". There is no specific limitation with respect to silver halide contained in the light-sensitive layer of the light-sensitive material. Examples of the silver halides include silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publication Nos. 57(1982)-154232, 58(1983)-108533, 59(1984)-48755 and 59(1984)-52237, U.S. Pat. No. 4,433,048, and European Pat. No. 100,984) can be employed. A silver halide grain having a core/shell structure in which the silver iodide content in the shell is higher than that in the core can be also employed.

There is no specific limitation on the crystal habit of silver halide grains. For example, a tubular grain having an aspect ratio of not less than 3 can be used.

The silver halide grains preferably have such a relatively low tendency to be fogged that the amount of developed silver is not more than 5 weight % based on the total amount of silver when the unexposed silver halide grains are developed in 1 l of an aqueous developing solution containing 1.0 g of metol, 15.0 g of sodium sulfite, 4.0 g of hydroquinone, 26.7 g of sodium carbonate monohydrate and 0.7 g of potassium bromide.

Two or more kinds of silver halide grains which differ in halogen composition, crystal habit, grain size, and/or other features from each other can be used in combination.

There is no specific limitation on grain size distribution of silver halide grains. For example, the silver halide grains having such a grain size distribution that the coefficient of the variation is not more than 20% can be employed.

The silver halide grains ordinarily have a mean size of 0.001 to 5 $\mu$m, more preferably 0.001 to 2 $\mu$m.

The total silver content (including silver halide and an organic silver salt which is one of optional components) in the light-sensitive layer preferably is in the range of from 0.1 mg/m$^2$ to 10 g/m$^2$. The silver content of the silver halide in the light-sensitive layer preferably is not more than 0.1 g/m$^2$, more preferably in the range of from 1 mg to 90 mg/m$^2$.

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, $\alpha$-sulfonamidoketones, hydrazines, etc. Depending on the nature or amount of the reducing agent, the polymerizable compound within either the area where a latent image of the silver halide has been formed or the area where a latent image of the silver halide has not been formed can be polymerized. In the developing system in which the polymerizable compound within the area where the latent image has been formed is polymerized, hydrazines are preferably employed as the reducing agent. In the developing system in which the polymerizable compound within the area where the latent image has not been formed is polymerized, 1-phenyl-3-pyrazolidone is preferably employed as the reducing agent.

The light-sensitive materials employing the reducing agent having these functions (including compounds referred to as developing agent, hydrazine derivative or precursor of reducing agent) are described in Japanese Patent Provisional Publication Nos. 61(1986)-183640, 61(1986)-188535 and 61(1986)-228441. These reducing agents are also described in T. James, "The Theory of the Photographic Process", 4th edition, pp. 291-334 (1977), Research Disclosure No. 17029, pp. 9-15 (June 1978), and Research Disclosure No. 17643, pp. 22-31 (December 1978). The reducing agents described in the these publications can be employed in the light-sensitive material of the present invention. Thus, "the reducing agent(s)" in the present specification means to include all of the reducing agents described in the above mentioned publications and applications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)-phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)-hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)-butyloyl}-2-(p- or o-aminophenyl)hydrazine, 1-{2-(2,5-di-t-pentylphenoxy)-butyloyl}-2-(p-or o-aminophenyl)-hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-(p-or o-methoxyphenyl)hydrazine, 1-(methoxycarbonylbenzohydryl)-2-phenylhydrazine, 1-formyl-2-[4-{2-(2,4-di-tert-pentyl-phenoxy)-butylamide}phenyl]hydrazine, 1-acetyl-2-[4-{2-(2,4-di-tert-pentylphenoxy)butylamido}phenyl]hydrazine, 1-acetyl-2-{2-(2,4-di-tert-pentylphenoxy)butylamide}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine, 1-trityl-2-[{2-(N-ethyl-N-octylsulfamoyl)-4-methanesulfonyl}phenyl]hydrazine, 1-benzoyl-2-tritylhydrazine, 1-(4-butoxybenzoyl)-2-tritylhydrazine, 1-(2,4-dimethoxybenzoyl)-2-tritylhydrazine, 1-(4-dibutylcarbamoylbenzoyl)-2-tritylhydrazine and 1-(1-naphthoyl)-2-tritylhydrazine.

The amount of the reducing agent in the light-sensitive layer preferably ranges from 0.1 to 1,500 mole % based on the amount of silver (contained in the above-mentioned silver halide and an organic silver salt).

There is no specific limitation with respect to the polymerizable compound, and any known polymerizable compounds including monomers, oligomers and polymers can be contained in the light-sensitive layer. In the imageforming method of the invention, a polymerizable compounds having a relatively higher boiling point (e.g., 80° C. or higher) is preferably employed because it is hardly evaporated upon heating. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds. Further, in the case that a transferred image is formed on an image-receiving material, the polymerizable compound preferably has a viscosity of not lower than 100 cP at 25° C.

Preferred polymerizable compounds employable for the light-sensitive material are compounds which are polymerizable through addition reaction or ring-opening reaction. Preferred examples of the compounds being polymerizable through addition reaction include compounds having an ethylenic unsaturated group. Preferred examples of the compounds being polymerizable through ringopening reaction include the compounds having an epoxy group. Among them, the compounds having an ethylenic unsaturated group are preferred.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. For example, a mixture of two or more polymerizable componds can be employed. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

In the light-sensitive material of the invention, the silver halide and polymerizable compound are contained in microcapsules to form light-sensitive microcapsules which are dispersed in the light-sensitive layer. The reducing agent is preferably contained in the light-sensitive microcapsules.

There is also no specific limitation on shell material of the microcapsule, and various known materials such as polymers which are employed in the conventional microcapsules can be employed as the shell material. Examples of the shell material include polyamide resin and/or polyester resin, polyurea resin and/or polyurethane resin, aminoaldehyde resin, gelatin, epoxy resin, a complex resin containing polyamide resin and polyurea resin, a complex resin containing polyurethane resin and polyester resin.

In the case that the shell material is composed of a condensed aldehyde resin, the residual aldehyde preferably is not more than 5 mole based on 1 mole of the reducing agent.

The microcapsules which contains five or more silver halide grains are preferably more than 50% by weight based on the total amount of the microcapsules. The silver halide grains are preferably arranged in the shell material of the microcapsules.

Further, two or more kinds of the microcapsules differing from each other with respect to at least one of the silver halide, polymerizable compound and color image forming substance can be employed. Furthermore, three or more kinds of the microcapsules differing from each other with respect to the color image forming substance is preferably employed to form a full color image.

The mean size of the microcapsule preferably ranges from 0.5 to 50 μm, more preferably 1 to 25 μm, most preferably 3 to 20 μm. The amount of the microcapsules having a particle size of not larger than one sixth part of the average particle size preferably is not more than 1 volume % of the total amount of the microcapsules. Further, the amount of the microcapsules having a particle size of not smaller than twice as large as the average particle size is not more than 1 volume % of the total amount of the microcapsules. Furthermore, the proportion of an average thickness of the shell of the microcapsules to the average particle size preferably ranges from $0.5 \times 10^{-2}$ to $5 \times 10^{-2}$.

The mean grain size of the silver halide grains preferably is not more than the 5th part of the mean size of the microcapsules, more preferably is not more than 10th part. It is observed that when the mean size of the microcapsules is not less than 5 times as much as the mean grain size of silver halide grains, even and uniform image can be obtained.

The light-sensitive material can be prepared by arranging a light-sensitive layer containing the abovementioned components on a support. There is no limitation with respect to the support. In the case that a heat development is utilized in the use of the light-sensitive material, the support preferably is resistant to heat given in the processing stage. Examples of the material employable as the support include glass, paper, fine paper, coat paper, cast-coated paper, baryta paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene). In the case that a porous material, such as paper is employed as the support, the porous support preferably has such a surface characteristic that a filtered maximum waviness of not less than 4 μm is observed in not more than 20 positions among 100 positions which are determined at random on a filtered waviness curve obtained according to JIS-B-0610. A surface of a paper support preferably has a low water absorptiveness of not more than 3 g/m² which is a value measured according to Cobb test method. A surface of the paper support preferably has such a smooth surface that the smoothness value in terms of the Bekk Smoothness is not less than 300 seconds. A paper support preferably has a low shrinkage ratio of not more than 0.15% both in the machine direction and in the cross direction, wherein the shrinkage ratio is a value measured at the change of relative humidity from 75% to 60%. Further, a paper support preferably has a low air permeability of not less than 300 seconds, wherein the air permeability is a time required for 100 ml of air to pass through the paper support of an area of 645 mm² at pressure of 567 g. Furthermore, a paper support preferably has a pH value in the range of 5 to 9.

The light-sensitive layer can further contain optional components such as color image forming substances, sensitizing dyes, organic silver salts, radical generators, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, dyes having a property of being decolorized when it is heated or irradiated with light, matting agents, antismudging agents, plasticizers, water releasers, binders, photo polymerization initiator, solvent of the polymerizable compound and water soluble vinyl polymers.

The light-sensitive material containing the abovementioned components can give a polymer image. When the light-sensitive material further contains a color image forming substance as an optional component, the material can give a color image.

There is no specific limitation with respect to the color image forming substance, and various kinds of substances can be employed. Thus, examples of the color image forming substance include both colored substance (i.e., dyes and pigments) and non-colored or almost noncolored substance (i.e., color former or dye- or pigmentprecursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145 (corresponding to U.S. Pat. No. 4,629,676 and European Patent Provisional Publication No. 0174634A2).

Examples of the dyes and pigments (i.e., colored substances) employable in the invention include commercially available ones, as well as various known compounds described in the technical publications, e.g. Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), pp. 29–58 (pressure-sensitive copying paper), pp. 87–95 (azo-graphy), pp. 118–120 (heat-sensitive color formation by a chemical change) or in MSS. of the seminar promoted by the Society of Kinki Chemical Industry, "The Newest Chemistry of Coloring Matter—Attractive Application and New Development as a Functional Coloring Matter", pp. 26–32 (June, 19, 1980).

In the case that the color image forming substance comprises two components (e.g., color former and a developer), one component and the polymerizable compound is contained in the microcapsule, and the other component is arranged outside of the microcapsule in the light-sensitive layer, a color image can be formed on the light-sensitive layer.

The color image forming substance in the light-sensitive material is preferably used in an amount of from 0.5 to 50 parts by weight, and more preferably from 2 to 30 parts by weight, per 100 parts by weight of the polymerizable compound. In the case that the developer is used, it is preferably used in an amount of from about 0.3 to about 80 parts by weight per one part by weight of the color former.

There is no specific limitation with respect to the sensitizing dyes, and known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide. The sensitizing dye is preferably added during the stage of the preparation of the silver halide emulsion (simultaneously with or after the grain formation).

In the heat-development process, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inorganic silver salt can be added to the light-sensitive layer to obtain the same effect.

Examples of the radical generators include triazene-silver, silver diazotate and an azo compound.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into oils, surface active agents, compounds functioning as an antifogging agent and/or a development accelerator, hot-melt solvents, antioxidants and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator are used to give a clear image having a high maximum density and a low minimum density (an image having high contrast). Examples of the compounds include a 5- or 6-membered nitrogen containing heterocyclic compound (including a cyclic amide compound), a thiourea derivative, a thioether compound, a polyethylene glycol derivative, a thiol derivative, an acetylene compound, a sulfonamide derivative and a quarternary ammonium salt.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having —SO$_2$— and/or —CO— group described in U.S. Pat. No. 3,347,675; polar compounds described in U.S. Pat. No. 3,667,959; and 1,10-decanediol, methyl anisate and biphenyl suberate described in Research Disclosure 26–28 (December 1976). The hot-melt solvent is preferably used in an amount of from 0.5 to 50% by weight, and more preferably from 1 to 20% weight, based on the total solid content of the light-sensitive layer.

The antioxidants can be used to eliminate the influence of the oxygen which has an effect of inhibiting polymerization in the development process. Example of the antioxidants is a compound having two or more mercapto groups.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", pp. 6–18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis(1-cyclohexanecarbonitrile), dimethyl 2,2'-azobisisobutyrate, 2,2'-azobis(2-methylbutyronitrile), and azobisdimethylvaleronitrile; organic peroxides, e.g., benzoyl peroxide, di-tert-butyl peroxide, dicumyl peroxide, tert-butyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. In a system in which the polymerizable compound within the area where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241.

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The dyes having a property of being decolorized when it is heated or irradiated with light can be used in the light-sensitive material as a yellow filter layer in a conventional silver salt photographic system.

The antismudging agents employable in the light-sensitive material preferably are particles which are solid at ambient temperatures. Examples of the antismudging agents include starch particles described in U.K. Pat. No. 1,232,347; polymer particles described in U.S. Pat. No. 3,625,736; microcapsule particles containing no color former described in U.K. Pat. No. 1,235,991; and cellulose particles, and inorganic particles, such as particles of talc, kaolin, bentonite, agalmatolite, zinc oxide, titanium dioxide or aluminum oxide described in U.S. Pat. No. 2,711,375. Such particles preferably have a mean size of 3 to 50 $\mu$m, more preferably 5 to 40 $\mu$m. When the microcapsule is employed in the light-sensitive material, the size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination. The light-sensitive material employing a binder is described in Japanese Patent Provisional Publication No. 61(1986)-69062 (corresponding to U.S. Pat. No. 4,629,676 and European Patent Provisional Publication No. 0174634A2).

A photo polymerization initiator can be contained in the light-sensitive layer to polymerize the unpolymerized polymerizable compound after the image-formation.

In the case that the solvent of the polymerizable compound is used, the solvent is preferably contained in a microcapsule which is different from the light-sensitive microcapsule.

In the case that the water soluble vinyl polymer is is used, the polymers are preferably adsorbed on the silver halide grains.

Examples and usage of the other optional components which can be contained in the light-sensitive layer are also described in the above-mentioned publications and applications concerning the light-sensitive material, and in Research Disclosure Vol. 170, No. 17029, pp. 9–15 (June 1978). The light-sensitive layer preferably has a pH value of not more than 7.

Examples of auxiliary layers which are optionally arranged on the light-sensitive material include an image-receiving layer, a heating layer, an antistatic layer, an anticurl layer, a release layer, a cover sheet or a protective layer and an antihalation layer (colored layer).

Instead of the use of the image-receiving material, the image-receiving layer can be arranged on the light-sensitive material to produce the desired image on the image-receiving layer of the light-sensitive material. The image-receiving layer of the light-sensitive material can be constructed in the same manner as the layer of the image-receiving material.

The light-sensitive material can be prepared, for instance, by the following process.

The light-sensitive material is usually prepared by dissolving, emulsifying or dispersing each of the components of the light-sensitive layer in an adequate medium to obtain coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

Preparations of liquid compositions and coating solutions of the components contained in the light-sensitive layer are described hereinbelow.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publication Nos. 55(1980)-142329 and 55(1980)-158124, and U.S. Pat. No. 3,650,757, etc.

The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivatives; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)-144319 can be used as a silver halide solvent. Further, in the grain formation or physical ripening, a cadmium salt, a zinc salt, a lead salt, a thallium salt, or the like can be introduced into the reaction system. Furthermore, for the purpose of overcoming high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When the sensitizing dyes are added to the silver halide emulsion, the sensitizing dye is preferably added during the preparation of the emulsion. When the organic silver salts are introduced in the light-sensitive microcapsule, the emulsion of the organic silver salts can be prepared in the same manner as in the preparation of the silver halide emulsion.

In the preparation of the light-sensitive material, the polymerizable compound (the term, "polymerizable compound" includes the photo polymerizable composition and photo polymerizable compound) is used as the medium for preparation of the liquid composition containing another component of the light-sensitive layer. For example, the silver halide, (including the silver halide emulsion), the reducing agent, the photo polymerization initiator or the color image forming substance can be dissolved, emulsified or dispersed in the polymerizable compound to prepare the light-sensitive material. Especially, the color image forming substance is preferably incorporated into the polymerizable compound. Further, the necessary components for preparation of a microcapsule, such as shell material can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispersed state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

the light-sensitive composition can be also prepared by dispersing microcapsule containing silver halide emulsion as a core structure in the polymerizable compound instead of employing the above polymer.

The polymerizable compound (including the light-sensitive composition) is preferably emulsified in an aqueous medium to prepare the coating solution. The necessary components for preparation of the microcapsule, such as shell material can be incorporated into the emulsion. Further, other components such as the reducing agent can be added to the emulsion. The emulsion of the polymerizable compound can be processed for forming shell of the microcapsule.

Examples of the process for preparation of the microcapsules include a process utilizing coacervation of hydrophilic wall-forming materials as described in U.S. Pat. Nos. 2,800,457 and 2,800,458; an interfacial polymerization process as described in U.S. Pat. No. 3,287,154, U.K. Pat. No. 990,443 and Japanese Patent Publication Nos. 38(1963)-19574, 42(1967)-446 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using urea-formaldehyde or urea-formaldehyde-resorcinol wall-forming materials as described in U.S. Pat. Nos. 4,001,140, 4,087,376 and 4,089,802; a process of using melamine-formaldehyde resins hydroxypropyl cellulose or like wall-forming materials as described in U.S. Pat. No. 4,025,455; an in situ process utilizing polymerization of monomers as described in U.K. Pat. No. 867,797 and U.S. Pat. No. 4,001,140; an electrolytic dispersion and cooling process as described in U.K. Pat. Nos. 952,807 and 965,074; a spray-drying process as described in U.S. Pat. No. 3,111,407 and U.K. Pat. No. 930,422; and the like. It is preferable, though not limitative, that the microcapsule is prepared by emulsifying core materials containing the polymerizable compound and forming a polymeric membrane (i.e., shell) over the core materials.

The particles containing the base or base precursor is adsorbed on the microcapsules to prepare the light-sensitive material of the invention. The dispersion of the microcapsule on which the particles are adsorbed can be used as the coating solution of the light-sensitive material. The other components can be added during the stage of the preparation of the coating solution in a similar manner as the above emulsion.

The light-sensitive material of the invention can be prepared by coating and drying the above-prepared coating solution on a supprot. The process for coating the coating solution on a support can be easily carried out in the conventional manner.

An image-forming method employing the light-sensitive material is described below.

The light-sensitive material of the invention is imagewise exposed with light to form a polymer image on the light-sensitive material.

Various exposure means can be employed in the imagewise exposure, and in general, the latent image on the silver halide is obtained by imagewise exposure to radiation including visible light. The type of light source and exposure can be selected depending on the light-sensitive wavelengths (sensitized wavelength when seinsitization is carried out) or sensitivity of silver halide. Original image can be either monochromatic image or color image.

Development of the light-sensitive material can be conducted simultaneously with or after the image exposure. The development can be conducted using a developing solution in the same manner as the image forming method described in Japanese Patent Publication No. 45(1970)-11149. The image forming method described in Japanese Patent Provisional Publication No. 61(1986)-69062 which employs a heat development process has an advantage of simple procedures and short processing time because of the dry process. Thus, the latter method is preferred as the development process of the light-sensitive material.

Heating in the heat-development process can be conducted in various known manners. The heating layer which is arranged on the light-sensitive material can be used as the heating means in the same manner as the light-sensitive material described in Japanese Patent Provisional Publication No. 61(1986)-294434. The light-sensitive material is preferably heated while suppressing supply of oxygen into the light-sensitive layer from outside. Heating temperatures for the development process usually ranges from 80° C. to 200° C., and preferably from 100° C. to 160° C. Various heating patterns are applicable. The heating time is usually not shorter than 1 second, preferably from 1 second to 5 minutes, and more preferably from 1 second to 1 minute.

During the above development process, a polymerizable compound within the area where a latent image of the silver halide has been formed or within the area where a latent image of the silver halide has not been formed is polymerized. In a general system, the polymerizable compound within the area where the latent image has been formed is polymerized. If a nature or amount of the reducing agent is controlled, the polymerizable compound within the area where the latent image has not been formed can be polymerized.

A polymer image can be formed on the light-sensitive layer in the above process. A color image can be obtained by fixing a dye or pigment on a polymer image.

Further, a color image can be formed on the light-sensitive material in which the light-sensitive layer contains a color former and a developer, one of them is together with the polymerizable compound contained in a microcapsule, and the other is arranged outside of the microcapsule.

In the image forming method employing the light-sensitive material, the image is preferably formed on an image-receiving material. The image-receiving material is described herein below.

Examples of the material employable as the support of the image-receiving material include glass, paper, fine paper, coat paper, cast-coated paper, baryta paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene). In the case that a porous material, such as paper is employed as the support of the image-receiving material, the porous support preferably has such a surface characteristic that a filtered maximum waviness of not less than 4 μm is observed in not more than 20 positions among 100 positions which are determined at random on a filtered waviness curve obtained according to JIS-B-1610. Further, a transparent material can be employed as the support of the image-receiving material to obtain a transparent or a projected image.

The image-receiving material is usually prepared by providing an image-receiving layer on the support. The image-receiving layer can be constructed according to the color formation system. In the cases that a polymer image is formed on the image-receiving material and that a dye or pigment is employed as the color image forming substance, the image-receiving material can be composed of a simple support.

For example, when a color formation system using a color former and developer is employed, the developer can be contained in the image-receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer preferably contains a polymer as binder. The binder which may be employed in the above-mentioned light-receiving layer is also employable in the image-receiving layer. Further, a polymer having a transmission coefficient of oxygen of not more than $1.0 \times 10^{-11}$ cm$^3 \cdot$cm/cm$^2 \cdot$sec$\cdot$cmHg can be used as the binder to protect the color of the image formed on the image-receiving material.

The image-receiving layer can contain a granulated thermoplastic compound to obtain a glossy image. There is no specific limitation with respect to the thermoplastic compound. The thermoplastic compound include known plastic resin and wax. The thermoplastic resin preferably has a glass transition temperature of not more than 200° C. The wax preferably has a melting point of not more than 200° C.

A photopolymerization initiator or a thermalpolymerization initiator can be contained in the image-receiving layer to polymerize the transferred unpolymerized polymerizable compound, so that the obtained image is fixed on the image-receiving layer.

A dye or pigment can be contained in the image-receiving layer for the purpose of entering letters, symbols, frames etc. in the image-receiving layer, or of giving a certain color to the background of the image. Further, the dye or pigment can be also employed for the purpose of making it easy to distinguish the sides of the image-receiving material. In the case that it is possible that the dye or pigment disturbs the image formed on the image-receiving layer, it is preferred that the density of the dye or pigment is low (e.g. reflection density of not higher than 1), or the dye or pigment has a property of being decolored when it is heated or irradiated with light.

Further, when a white pigment, such as titanium dioxide, barium sulfate etc. is contained in the imagereceiving layer, the image-receiving layer can function as a white reflection layer. In this case, the white pigment is used in an amount of from 10 g to 100 g based on 1 g of the thermoplastic material.

The above-mentioned dye and pigment can be either uniformly or partially contained in the image-receiving layer. For example, when the support is composed of transparent material, the white pigment can be partially contained in the image-receiving layer to make a part of a reflection image to be transparent. Thus, information of the image which is unnecessary in a transparent image can be entered in the part of the image-receiving layer containing the white pigment as the reflection image.

The image-receiving layer can be composed of two or more layers according to the above-mentioned functions. The thickness of the image-receiving layer preferably ranges from 1 to 100 μm, more preferably from 1to 20 μm.

A protective layer can be provided on the surface of the image-receiving layer. A layer containing a granulated thermoplastic compound can be also provided on the image-receiving layer.

A layer containing an adhesive and a release paper can be provided in the order on the support of the image-receiving material on the opposite side of the image-receiving layer.

After the image exposure and/or the development process, pressing the light-sensitive material on the image-receiving material to transfer the unpolymerized polymerizable compound to the image-receiving material, a polymer image can be obtained in the image-receiving material. The process for pressing can be carried out in various known manners.

In the case that the light-sensitive layer contains a color image forming substance, the color image forming substance is fixed by polymerization of the polymerizable compound. Then, pressing the light-sensitive material on the image-receiving material to transfer the color image forming substance in unfixed portion, a color image can be produced on the image-receiving material.

After the image is formed on the image-receiving material, the image-receiving material can be heated to polymerize the transferred unpolymerized polymerizable compound. By the above-mentioned process, the obtained image can be improved in the preservability.

Various image recording apparatus can be used for the image-forming method. An example of the apparatus comprises an exposure device for imagewise exposing the light-sensitive material to form a latent image, a heat development device for fixing the area corresponding to the latent image, a transfer device for pressing the developed light-sensitive material on the image-receiving material. Another example of the apparatus comprises an fixing apparatus for irradiating with light, pressing or heating the image-receiving material on which an image has been transferred in addition to the above-mentioned devices.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention.

EXAMPLE 1

Preparation of microcapsule containing base

In 8 g of methylene chloride was dissolved 3 g of tricyclohexylguanidine. To the solution was added 3 g of an adduct of xylylene diisocyanate and trimethylolpropane. The mixture was added to 40 g of 2% aqueous solution of polyvinyl alcohol (PVA-205; produced by Kuraray Co., Ltd.). The resulting mixture was stirred at 9,000 r.p.m. for 1 minutes in a homogenizer to obtain an emulsion. The average particle size of the emulsion was about 2 μm. The emulsion was heated at 40° C. for 2 hours while stirring to obtain a dispersion of microcapsules containing base.

Preparation of silver halide emulsion

In 1,000 ml of water were dissolved 20 g of gelatin and 3 g of sodium chloride, and the resulting gelatin solution was kept at 75° C. To the gelatin solution, 600 ml of an aqueous solution containing 21 g of sodium chloride and 56 g of potassium bromide and 600 ml of an aqueous solution containing 0.59 mole of silver nitrate were added simultaneously at the same feed rate over a period of 40 minutes to obtain a silver chlorobromide emulsion having cubic grains, uniform grain size distribution, a mean grain size of 0.35 μm and a bromide content of 80 mole %.

The emulsion was washed for desalting and then subjected to chemical sensitization with 5 mg of sodium thiosulfate and 20 mg of 4-hydroxy-6-methyl-1,3,3a,7-tetrazaindene at 60° C. Yield of the emulsion was 600 g.

Preparation of light-sensitive composition

In 100 g of trimethylolpropane triacrylate were dissolved 0.40 g of the following copolymer, 6.00 g of Pargascript Red I-6-B (tradename of Ciba-Geigy) and 2 g of Nonion NS-208.5 (tradename of Nippon Oils & Fats Co., Ltd.).

(Copolymer)

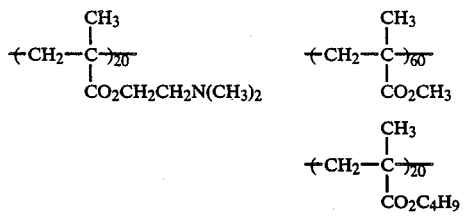

In 18.00 g of the solution was dissolved 0.002 g of the following thiol derivative.

(Thiol derivative)

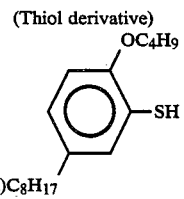

To the resulting solution was added a solution in which 1.16 g of the following reducing agent (I) and 1.22 g of the following reducing agent (II) are dissolved in 4.0 g of methylene chloride.

(Reducing agent (I))

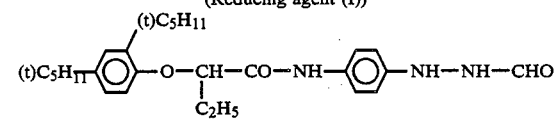

(Reducing agent (II))

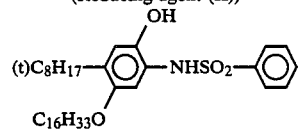

To the resulting solution was added 3.50 g of the silver halide emulsion, and the mixture was stirred at 15,000 r.p.m. for 5 minutes to obtain a light-sensitive composition.

Preparation of light-sensitive microcapsule

To 10.51 g of 18.6% aqueous solution of Isobam (tradename of Kuraray Co., Ltd.) was added 48.56 g of 2.89% aqueous solution of pectin. After the solution was adjusted to a pH of 4.0 using 10% sulfuric acid, the light-sensitive composition was added to the resulting solution, and the mixture was stirred at 7,000 r.p.m. for 2 minutes to emulsify the light-sensitive composition in the aqueous medium.

To 72.5 g of the aqueous emulsion were added 8.32 g of 40% aqueous solution of urea, 2.82 g of 11.3% aqueous solution of resorcinol, 8.56 g of 37% aqueous solution of formaldehyde and 2.76 g of 8.76% aqueous solution of ammonium sulfate in this order, and the mixture was heated at 60° C. for 30 hours while stirring. To the mixture was added the dispersion of microcapsules containing base, and the resulting mixture was heated for 90 minutes. After the mixture was adjusted to a pH of 7.2 using 10% aqueous solution of sodium hydroxide, 3.62 g of 30.9% aqueous solution of sodium hydrogen sulfite was added to the mixture to obtain a dispersion of light-sensitive microcapsules on which microcapsules containing base were adsorbed.

Preparation of light-sensitive material

To 10.0 g of the light-sensitive microcapsule dispersion were added 2 g of 20% aqueous solution of the sorbitol and Nonion NS-208.5 (tradename of Nippon Oils & Fats Co., Ltd.) to prepare a coating solution. The coating solution was uniformly coated on the surface of the coating layer of the paper support (a) using a coating rod of #40 to give a light-sensitive layer having wet thickness of 70 μm and dried at about 40° C. to obtain a light-sensitive material (A).

When the obtained light-sensitive layer was observed under an optical microscope, at least about 40% of the microcapsules containing base were adsorbed on the surface of the light-sensitive microcapsules.

EXAMPLE 2

Preparation of dispersion of base precursor

To 12 g of powder of tricyclohexylguanidine trichloroacetate was added 86 g of 4% aqueous solution of polyvinyl alcohol (PVA-217E; produced by Kuraray Co., Ltd.). The mixture was stirred for 2 hours in Dynomile to obtain a dispersion. The dispersion was adjusted to pH of 5 using 10% sulfuric acid to obtain a dispersion of solid particles of base precursor.

Preparation of light-sensitive microcapsule

A dispersion of light-sensitive microcapsules on which particles of base precursor were adsorbed was prepared in the same manner as in Example 1, except that 40 g of the dispersion of solid particles of base precursor was used in place of the dispersion of microcapsules containing base.

Preparation of light-sensitive material

A light-sensitive material were prepared in the same manner as in Example 1, except that the above-prepared dispersion of the light-sensitive microcapsules was used.

Preparation of image-receiving material

To 125 g of water was added 11 g of 40% aqueous solution of sodium hexametaphosphate, and were further added 34 g of zinc 3,5-di-α-methylbenzylsalicylate and 82 g of 55% slurry of calcium carbonate, followed by coarsely dispersing in a mixer. The coarse dispersion was then finely dispersed in Dynomill dispersing device. To 200 g of the resulting dispersion were added 6 g of 50% latex of SBR (styrene-butadiene rubber) and 55 g of 8% aqueous solution of polyvinyl alcohol, and the resulting mixture was made uniform. The mixture was then uniformly coated on an art paper having basis weight of 43 g/m² to give a layer having a wet thickness of 30 μm and dried to obtain an image-receiving material.

Evaluation of light-sensitive material

Each of the light-sensitive materials prepared in Examples 1 & 2 was imagewise exposed to light using a tungsten lamp at 2,000 lux for 1 second, and then heated on a hot plate at 125° C. for 40 seconds. Each of the exposed and heated light-sensitive materials was then combined with the image-receiving material and passed through press rolls at pressure of 350 kg/cm². As a result, a clear magenta positive image was obtained on the image receiving material from each of the light-sensitive materials.

I claim:

1. A light-sensitive material comprising a light-sensitive layer containing silver halide, a reducing agent, an ethylessically unsaturated polymerizable compound and a base or base precursor provided on a support, said silver halide and polymerizable compound are contained in microcapsules to form light-sensitive microcapsules which are dispersed in the light-sensitive layer, wherein the base or base precursor is contained in particles which are arranged outside of the light-sensitive microcapsules, at least 30% of said particles being adsorbed on the surface of the light-sensitive microcapsules.

2. The light-sensitive material as claimed in claim 1, wherein at least 50% of the particles are adsorbed on the surface of the light-sensitive microcapsules.

3. The light-sensitive material as claimed in claim 1, wherein at least 70% of the particles are adsorbed on the surface of the light-sensitive microcapsule.

4. The light-sensitive material as claimed in claim 1, wherein the particles are solid particles of the base or base precursor.

5. The light-sensitive material as claimed in claim 1, wherein the particles are microcapsules containing the base or base precursor other than the light-sensitive microcapsules.

6. The light-sensitive material as claimed in claim 1, wherein the base or base precursor has a melting point in the range of 70° to 210° C.

7. The light-sensitive material as claimed in claim 1, wherein the base or base precursor has a solubility in water of not more than 0.1 weight % at 25° C.

8. The light-sensitive material as claimed in claim 1, wherein the base or a base formed from the base precursor has a pKa of not less than 7.

9. The light-sensitive material as claimed in claim 1, wherein the base or base precursor is a guanidine derivative.

10. The light-sensitive material as claimed in claim 1, wherein the base or base precursor is contained in the light-sensitive layer in an amount of 0.1 to 40 weight % based on the total solid content of the light-sensitive layer.

11. The light-sensitive material as claimed in claim 1, wherein the light-sensitive layer contains a color image forming substance.

12. The light-sensitive material as claimed in claim 1, wherein the reducing agent is contained in the light-sensitive microcapsules.

* * * * *